United States Patent
Waitl et al.

(10) Patent No.: US 7,005,311 B2
(45) Date of Patent: Feb. 28, 2006

(54) TWO-POLE SMT MINIATURE HOUSING FOR SEMICONDUCTOR COMPONENTS AND METHOD FOR THE MANUFACTURE THEREOF

(75) Inventors: Guenther Waitl, Regensburg (DE); Franz Schellhorn, Regensburg (DE); Herbert Brunner, Regensburg (DE)

(73) Assignee: Osram GmbH (DE)

( * ) Notice: Subject to any disclaimer, the term of this patent is extended or adjusted under 35 U.S.C. 154(b) by 90 days.

(21) Appl. No.: 10/723,928

(22) Filed: Nov. 26, 2003

(65) Prior Publication Data

US 2004/0082113 A1 Apr. 29, 2004

Related U.S. Application Data

(62) Division of application No. 10/147,672, filed on May 15, 2002, now Pat. No. 6,716,673, which is a division of application No. 08/866,064, filed on May 30, 1997, now Pat. No. 6,432,745, which is a continuation of application No. 08/861,599, filed on Jul. 29, 1996, now abandoned, which is a continuation of application No. 08/316,247, filed on Sep. 30, 1994, now abandoned.

(30) Foreign Application Priority Data

Sep. 30, 1993 (DE) .................................. P 43 33 392

(51) Int. Cl.
 *H01L 21/00* (2006.01)

(52) U.S. Cl. ............................. 438/26; 438/64
(58) Field of Classification Search ................ 438/26, 438/64, 123, 124
 See application file for complete search history.

(56) References Cited

U.S. PATENT DOCUMENTS

| | | | |
|---|---|---|---|
| 3,529,200 A | 9/1970 | Potter et al. |
| 3,573,568 A | 4/1971 | Siegel |
| 3,742,833 A | 7/1973 | Sewell et al. |
| 3,774,086 A | 11/1973 | Vincent, Jr. |
| 3,976,877 A | 8/1976 | Thillays |
| 4,203,792 A | 5/1980 | Thompson |

(Continued)

FOREIGN PATENT DOCUMENTS

| | | |
|---|---|---|
| DE | 1915290 | 10/1969 |
| DE | 2347289 | 4/1974 |
| DE | 28 29 260 | 1/1980 |
| DE | 3315675 | 11/1983 |
| DE | 3227645 | 1/1984 |
| DE | 4446566 | 6/1996 |

(Continued)

*Primary Examiner*—David A. Zarneke
(74) *Attorney, Agent, or Firm*—Fish & Richardson P.C.

(57) ABSTRACT

In a two-pole SMT miniature housing in leadframe technique for semiconductor components, a semiconductor chip is mounted on one leadframe part and is contacted to a further leadframe part. The further leadframe part is conducted out of the housing in which the chip is encapsulated as a solder terminal. No trimming or shaping process is required and the housing is tight and is capable of further miniaturization. The solder terminals as punched parts of the leadframe are conducted projecting laterally from the housing sidewalls residing opposite one another at least up to the housing floor which forms the components' mounting surface. The chip mounting surface and the components' mounting surface form a right angle with one another.

6 Claims, 1 Drawing Sheet

U.S. PATENT DOCUMENTS

| | | |
|---|---|---|
| 4,307,297 A | 12/1981 | Groff et al. |
| 4,478,588 A | 10/1984 | Lockard |
| 4,660,127 A | 4/1987 | Gunter |
| 4,727,457 A | 2/1988 | Thillays |
| 4,733,014 A | 3/1988 | Fierkens et al. |
| 4,843,280 A | 6/1989 | Lumbard et al. |
| 4,851,695 A | 7/1989 | Stein |
| 4,875,750 A | 10/1989 | Spaeth et al. |
| 4,935,856 A | 6/1990 | Dragoon |
| 4,941,067 A | 7/1990 | Craft |
| 4,945,398 A | 7/1990 | Kurita et al. |
| 4,955,820 A | 9/1990 | Yamada et al. |
| 5,014,418 A | 5/1991 | Wright |
| 5,035,483 A | 7/1991 | Waitl et al. |
| 5,040,868 A | 8/1991 | Waitl et al. |
| 5,043,791 A | 8/1991 | Stokes et al. |
| 5,049,527 A | 9/1991 | Merrick et al. |
| 5,070,039 A | 12/1991 | Johnson et al. |
| 5,093,713 A | 3/1992 | Sawaya |
| RE34,254 E | 5/1993 | Dragoon |
| 5,224,021 A | 6/1993 | Takada et al. |
| 5,273,460 A | 12/1993 | Arai |
| 5,289,344 A | 2/1994 | Gagnon et al. |
| 5,294,897 A | 3/1994 | Notani et al. |
| 5,367,124 A | 11/1994 | Hoffman et al. |
| 5,479,050 A | 12/1995 | Pritchard et al. |
| 5,543,657 A | 8/1996 | Diffenderfer et al. |
| 5,608,553 A | 3/1997 | Kim |
| 5,614,735 A | 3/1997 | Kitamura et al. |
| 5,659,950 A | 8/1997 | Adams et al. |
| 5,685,071 A | 11/1997 | Gates, Jr. et al. |
| 5,706,177 A | 1/1998 | Nather et al. |
| 5,844,305 A | 12/1998 | Shin et al. |
| 5,863,810 A | 1/1999 | Kaldenberg |
| 5,907,151 A | 5/1999 | Gramann et al. |
| 6,459,130 B1 | 10/2002 | Arndt et al. |

FOREIGN PATENT DOCUMENTS

| | | |
|---|---|---|
| DE | 19536454 | 4/1997 |
| EP | 0373003 | 6/1990 |
| EP | 0400176 | 12/1990 |
| EP | 0532974 | 3/1993 |
| EP | 0646971 | 4/1995 |
| FR | 2004989 | 12/1969 |
| JP | 51-145288 | 2/1976 |
| JP | 53-068992 | 6/1978 |
| JP | 58194382 | 11/1983 |
| JP | 61-248839 | 11/1986 |
| JP | 62-263663 | 11/1987 |
| JP | 62-263667 | 11/1987 |
| JP | 63052455 | 5/1988 |
| JP | 1117227 | 5/1989 |
| JP | 2-156558 | 6/1990 |
| JP | 3171682 | 7/1991 |
| JP | 3-250657 | 11/1991 |
| JP | 3287690 | 12/1991 |
| JP | 4-62942 | 2/1992 |
| JP | 40667462 | 3/1992 |
| JP | 4128811 | 4/1992 |
| JP | 4-139732 | 5/1992 |
| JP | 5315652 | 11/1993 |
| JP | 5315653 | 11/1993 |
| JP | 6053554 | 2/1994 |
| JP | 6163083 | 6/1994 |
| JP | 6204570 | 7/1994 |
| JP | 6204604 | 7/1994 |
| JP | 7176794 | 7/1995 |
| JP | 7335980 | 12/1995 |
| JP | 8007614 | 1/1996 |
| JP | 930981 | 11/1997 |
| WO | 98/20718 | 5/1998 |

US 7,005,311 B2

TWO-POLE SMT MINIATURE HOUSING FOR SEMICONDUCTOR COMPONENTS AND METHOD FOR THE MANUFACTURE THEREOF

This is a divisional application of Ser. No. 10/147,672 filed May 15, 2002, now U.S. Pat. No. 6,716,673 which was a divisional application of application Ser. No. 08/866,064 filed May 30, 1997 issued as U.S. Pat. No. 6,432,745 on Aug. 13, 2002, which was a continuation of application Ser. No. 08/681,599, filed on Jul. 29, 1996, now abandoned, which was a continuation of application Ser. No. 08/316,247, filed Sep. 30, 1994, now abandoned.

BACKGROUND OF THE INVENTION

The invention is directed to a two-pole SMT (surface mount technology) miniature housing in leadframe technique for a semiconductor component, whereby a semiconductor chip encapsulated in a housing is mounted on a leadframe part and is contacted to another leadframe part which is conducted out of the housing as a solder terminal.

In known SMT housings in leadframe technique, for example given a SOD 123 housing, the solder terminals for the semiconductor component must be punched free and bent in a specific way after the encapsulation of the semiconductor component which, for example, occurs by casting, extruding or extrusion coating. This trimming and shaping process is necessary in order to guide the solder terminals past the housing such that such SMDs (surface mounted devices) can be mounted on a printed circuit board or mother board. The chip mounting area on the leadframe in the mounted condition thereby proceeds parallel to the PCB (printed circuit board), or to the mother board.

SUMMARY OF THE INVENTION

It is an object of the invention to create a SMT miniature housing for a semiconductor component that can be easily manufactured without such a trimming and shaping process, that is reliably tight and can also be further miniaturized, and that is distinguished by a high heat elimination.

In a two-pole SMT miniature housing of the type initially cited, this object is achieved in that the solder terminals, as punched parts of the leadframe, project laterally from housing sidewalls lying opposite one another at least up to the housing floor that forms the components' mounting surface, whereby the chip mounting surface and the components' mounting surface form a right angle relative to one another.

Advantageously, the solder terminals have a thickness of approximately 0.2 mm–0.5 mm. The SMT miniature housing is especially suited for optoelectronic semiconductor components, particularly for optosemiconductors that receive or transmit optical radiation at the side, referred to as sidelookers.

The two-pole SMT miniature housing is manufactured according to the invention such that leadframe parts serving as finished solder terminals in a leadframe are fabricated by punching, and such that the semiconductor chip is then mounted on the one leadframe part and is contacted to the other leadframe part. The semiconductor chip is encapsulated in a housing by casting, extrusion or extrusion-coating such that the right-angled legs of the finished solder terminals at two outsides of the housing lying opposite one another are conducted at least up to the floor or mounting surface thereof. The finished SMT miniature housing then only has to be punched free from the leadframe. Components manufactured in this technique are then, for example, soldered onto a PCB such that the chip mounting surface resides perpendicularly relative to the PCB.

The advantages achieved with the invention are particularly comprised in that the manufacturing step of trimming and shaping the solder terminals is eliminated in the manufacture of the SMT miniature housing and is integrated in the punching process for shaping the leadframe. The solder terminals—in their punched form as finished component parts—then only have to be punched free from the lead frame. Resulting therefrom is that bending stress is no longer exerted on the component and, for example, the occurrence of micro-cracks is prevented. Fewer deviations from the tolerances in the finished housing also occur since a bending of the solder terminals is no longer necessary. The dimensional accuracy of the solder terminals is thus especially improved. A corresponding leadframe shaping also makes it possible to avoid a deflashing of the terminals after their encapsulation. In particular, the dissipated power of the components can be increased by employing thicker leadframes than in known housings. Moreover, due to the improved arrangement of chip and leadframe or solder terminals, the housing can be further miniaturized.

DESCRIPTION OF THE PREFERRED EMBODIMENTS

Figure 1:
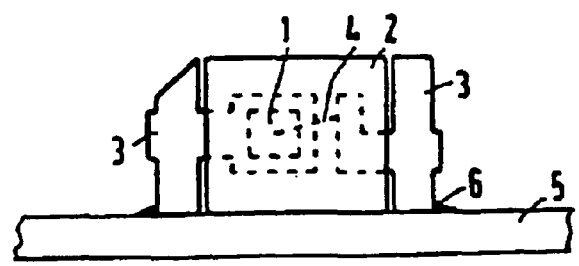
FIG. 1 shows a SMT miniature housing in a side view.
Figure 2:
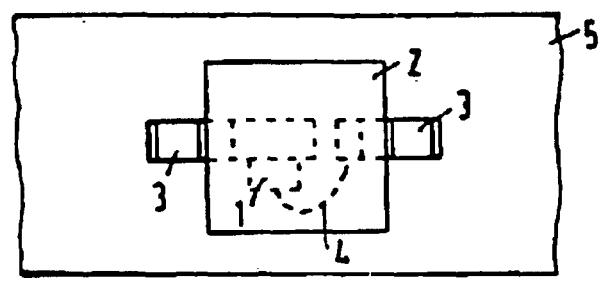
FIG. 2 is a plan view onto the housing of FIG. 1.

The two-pole SMT miniature housing shown in FIGS. 1 and 2 is manufactured in a leadframe technique. A semiconductor chip is thereby mounted on a leadframe part and is contacted to a further leadframe part with a wire 4. The two leadframe parts are conducted out of the housing 2 as solder terminals 3; for example, an IRED, LED or photodiode is encapsulated in the housing 2 as chip 1. The two solder terminals 3 are punched as finished solder terminals 3 from the leadframe having the desired contours in a punching process, and therefore need no longer be shaped afterwards. After the punching process, the semiconductor chip 1 is mounted on the one leadframe part or solder terminal 3, and is then encapsulated in plastic by casting, extruding or extrusion coating. The two solder terminals 3, as punched parts of the leadframe, are thereby conducted at least up to the floor of the housing 2 that forms the components' mounting surface, and project outwardly from housing sidewalls that reside opposite one another. The chip mounting surface and the components' mounting surface or bottom surface of the housing 2 thereby describe a right angle relative to one another. The finished SMT miniature housing is then soldered onto a mother board or printed circuit board 5 such that the chip mounting surface or the surface erected by the leadframe resides perpendicularly relative to the printed circuit board 5 or relative to the PCB.

Figure 3:
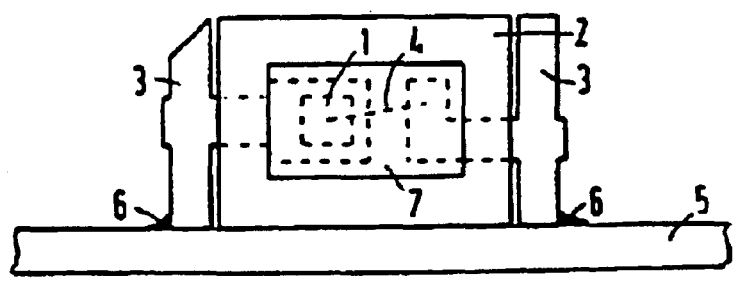
FIG. 3 is another SMT miniature housing in a side view.
Figure 4:
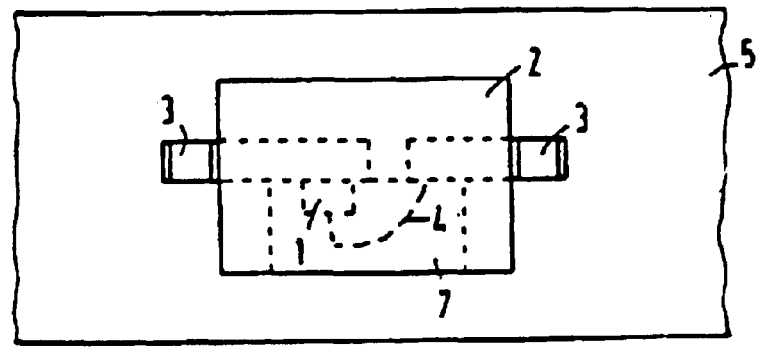
FIG. 4 is a plan view onto the housing of FIG. 3.

The two-pole SMT miniature housing shown in FIGS. 3 and 4 is employed for optoelectronic semiconductor components having side-looking emission or reception characteristics. Such components are also referred to as sidelookers. The SMT-compatible housing is composed of the two leadframe parts that form the solder terminals 3 and that are punched from the lead frame in the desired shape. An optosemiconductor is mounted on the one leadframe part as a semiconductor chip, and is contacted to the second leadframe part or solder terminal part 3 via a bond wire 4. The chip mounting can thereby also occur on a pre-housed leadframe. In this exemplary embodiment, a space serving as reflector 7 is recessed in the housing 2, the chip 1 being cast out therein with a transparent casting resin after the mounting so that the desired sidelooker is produced. The chip mounting surface and the component's mounting surface again form a right angle with one another. The finished product, for example, can then be soldered onto a PCB or onto a printed circuit board 5 such that the chip mounting surface resides perpendicularly on the surface that is formed by the printed circuit board 5. The soldering of the SMT miniature housing to a printed circuit board 5 is indicated with the solder meniscus 6 in FIGS. 1 and 3.

Although various minor changes and modifications might be proposed by those skilled in the art, it will be understood that we wish to include within the scope of the patent warranted hereon all such changes and modifications as reasonably come within our contribution to the art.

What is claimed is:

1. A method for manufacturing an optoelectronic semiconductor chip component comprising a two-pole surface mount technology (SMT) miniature housing in lead frame technique for an optoelectronic semiconductor chip, comprising the steps of:

punching out first and second lead frame parts each having a portion for extending into the housing and a leg portion for serving as a respective solder terminal running at a right angle to the portion extending into the housing;

pre-housing the lead frame parts with said miniature housing such that said right-angle leg portions of the lead frame parts forming solder terminals are positioned at two opposite sides of the housing and extend to and terminate at a bottom of the housing serving as a mounting surface for mounting the housing onto at least one of a printed circuit board and another mother board with the mounting surface on a top of the at least one of printed circuit board and mother board and ends of the solder terminals terminating at the top surface of the at least one of printing circuit board and mother board, and such that during the entire method no trimming and shaping the solder terminals is carried out so that no bending stress is exerted on the housing, and wherein said housing having a space recessed therein which serves as a reflector;

mounting the optoelectronic semiconductor chip inside the space on the first lead frame part and contacting the semiconductor chip to the second lead frame part; and casting out the semiconductor chip in the space with a casting resin.

2. The method according to claim 1 wherein the solder terminals have a thickness of approximately 0.2 mm–0.5 mm.

3. The method according to claim 1 wherein the optoelectronic chip component has side-looking emission characteristics.

4. The method according to claim 1 wherein the optoelectronic chip component has side-looking reception characteristics.

5. A method for manufacturing an optoelectronic semiconductor chip component, comprising the steps of:

punching out first and second lead frame parts each having a portion for extending into the housing and a leg portion for serving as a respective solder terminal running at a right angle to the portion extending into the housing;

housing the lead frame parts within a surface mount technology such that said right-angle leg portions of the lead frame parts forming solder terminals are positioned at opposite sides of the housing and extend to and terminate at a bottom of the housing serving as a mounting surface for mounting the housing onto at least one of a printed circuit board and another mother board with the mounting surface on a top of the at least one of printed circuit board and mother board and ends of the solder terminals terminating at the top surface of the at least one of printing circuit board and mother board, and such that no trimming and shaping of the solder terminals is carried out after the housing of the lead from parts so that no bending stress is exerted on the housing, and wherein said housing having a space recessed therein which serves as a reflector;

mounting the optoelectronic semiconductor chip inside the space on the first lead frame part and contacting the semiconductor chip to the second lead frame part; and filling the space with a filling material.

6. The method according to claim 1 wherein the filling material comprises a casting resin.

\* \* \* \* \*

UNITED STATES PATENT AND TRADEMARK OFFICE
CERTIFICATE OF CORRECTION

PATENT NO. : 7,005,311 B2  
APPLICATION NO. : 10/723928  
DATED : February 28, 2006  
INVENTOR(S) : Gunther Waitl, Franz Schellhorn and Herbert Brunner It is certified that error appears in the above-identified patent and that said Letters Patent is hereby corrected as shown below:

Column 4  
Line 42, Claim 6, delete "according to claim 1" and insert --according to claim 5--

Signed and Sealed this

Thirteenth Day of November, 2007

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,005,311 B2 | Page 1 of 1 |
| APPLICATION NO. | : 10/723928 | |
| DATED | : February 28, 2006 | |
| INVENTOR(S) | : Gunther Waitl, Franz Schellhorn and Herbert Brunner | |

It is certified that error appears in the above-identified patent and that said Letters Patent is hereby corrected as shown below:

Column 4
Line 42, Claim 6, delete "according to claim 1" and insert --according to claim 5--

Signed and Sealed this

Twenty-seventh Day of November, 2007

JON W. DUDAS
*Director of the United States Patent and Trademark Office*